(12) United States Patent
Keller et al.

(10) Patent No.: US 6,791,141 B1
(45) Date of Patent: Sep. 14, 2004

(54) SEMICONDUCTOR CONSTRUCTIONS COMPRISING STACKS WITH FLOATING GATES THEREIN

(75) Inventors: J. Dennis Keller, Boise, ID (US); Roger R. Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/172,096

(22) Filed: Oct. 13, 1998

Related U.S. Application Data

(62) Division of application No. 09/118,359, filed on Jul. 17, 1998.

(51) Int. Cl.[7] .............................................. H01L 29/788
(52) U.S. Cl. ......................... 257/316; 257/317; 257/321
(58) Field of Search ................................ 257/315–317, 257/321, 412; 438/257, 264

(56) References Cited

U.S. PATENT DOCUMENTS

| | | | |
|---|---|---|---|
| 4,143,178 A | | 3/1979 | Harada et al. |
| 4,337,476 A | | 6/1982 | Fraser et al. .................. 357/67 |
| 4,354,309 A | * | 10/1982 | Gardiner et al. ............. 257/412 |
| 4,597,159 A | | 7/1986 | Usami et al. .................. 29/571 |

(List continued on next page.)

FOREIGN PATENT DOCUMENTS

| EP | 0 660 408 A1 | 6/1995 | .................. 23/525 |
|---|---|---|---|
| KP | 10-135358 | * 5/1998 | |

OTHER PUBLICATIONS

Sze, S. M., Semiconductor Devices, Physics and Technology, AT&T Bell Laboratories, p. 364, 1985.*

"A 0.54 $\mu m^2$ Self–Aligned, HSG Floating Gate Cell (SAHF Cell) for 256Mbit Flash Memories" by H. Shirai et al., 1995 IEEE, pp. 653–656.

"A High Capacitive–Coupling Ratio (HiCR) Cell for 3 V–Only 64 Mbit and Future Flash Memories" by Yosiaki S. Hisamune et al., 1993 IEEE, pp. 19–22.

"Solid State Electronic Devices". Ben G. Streetman, Solid State Physical Electronics Series, 1972, 5 pages.

Silicon Processing for the VLSI Era, Stanley Wolf, vol. 2: Process Integration, 2 pages.

*Primary Examiner*—Thien F Tran
(74) *Attorney, Agent, or Firm*—Wells St. John P.S.

(57) ABSTRACT

Floating gate transistors and methods of forming the same are described. In one implementation, a floating gate is formed over a substrate. The floating gate has an inner first portion and an outer second portion. Conductivity enhancing impurity is provided in the inner first portion to a greater concentration than conductivity enhancing impurity in the outer second portion. In another implementation, the floating gate is formed from a first layer of conductively doped semiconductive material and a second layer of substantially undoped semiconductive material. In another implementation, the floating gate is formed from a first material having a first average grain size and a second material having a second average grain size which is larger than the first average grain size.

33 Claims, 4 Drawing Sheets

U.S. PATENT DOCUMENTS

| | | | |
|---|---|---|---|
| 4,751,193 A | 6/1988 | Myrick | 437/19 |
| 4,789,560 A | 12/1988 | Yen | 427/96 |
| 4,814,291 A | 3/1989 | Kim et al. | 437/101 |
| 4,874,716 A | 10/1989 | Rao | 437/43 |
| 5,070,032 A | 12/1991 | Yuan et al. | 437/43 |
| 5,086,008 A | 2/1992 | Riva | 437/41 |
| 5,216,270 A | 6/1993 | Kaya et al. | 257/321 |
| 5,229,631 A * | 7/1993 | Woo | 257/314 |
| 5,256,894 A | 10/1993 | Shino | |
| 5,272,099 A | 12/1993 | Chou et al. | |
| 5,298,436 A | 3/1994 | Radosevich et al. | 437/29 |
| 5,352,619 A | 10/1994 | Hong | |
| 5,389,567 A | 2/1995 | Acovic et al. | 437/52 |
| 5,443,998 A | 8/1995 | Meyer | 437/241 |
| 5,446,299 A | 8/1995 | Acovic et al. | 257/316 |
| 5,514,885 A | 5/1996 | Myrick | 257/216 |
| 5,534,456 A | 7/1996 | Yuan et al. | 437/43 |
| 5,541,138 A | 7/1996 | Yamazaki et al. | 437/174 |
| 5,557,122 A | 9/1996 | Shrivastava et al. | 257/309 |
| 5,569,615 A | 10/1996 | Yamazaki et al. | 437/43 |
| 5,652,447 A * | 7/1997 | Chen et al. | 257/315 |
| 5,814,543 A * | 9/1998 | Nishimoto et al. | 438/264 |
| 5,814,862 A * | 9/1998 | Sung et al. | 257/344 |
| 5,840,607 A * | 11/1998 | Yeh et al. | 438/257 |
| 5,882,994 A * | 3/1999 | Araki et al. | 438/593 |
| 5,888,870 A * | 3/1999 | Gardner et al. | 438/261 |
| 6,008,517 A * | 12/1999 | Wu | 257/321 |

* cited by examiner

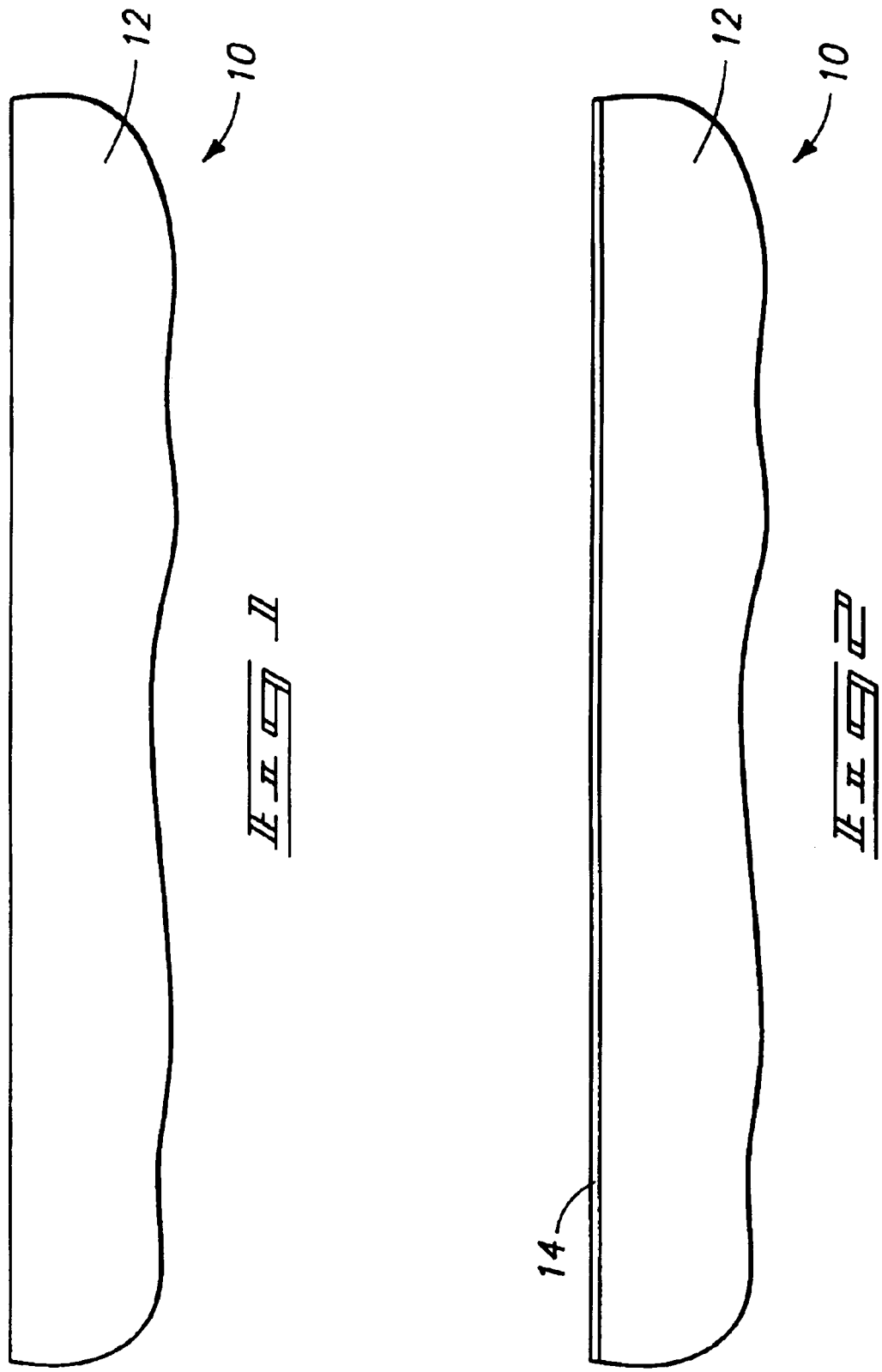

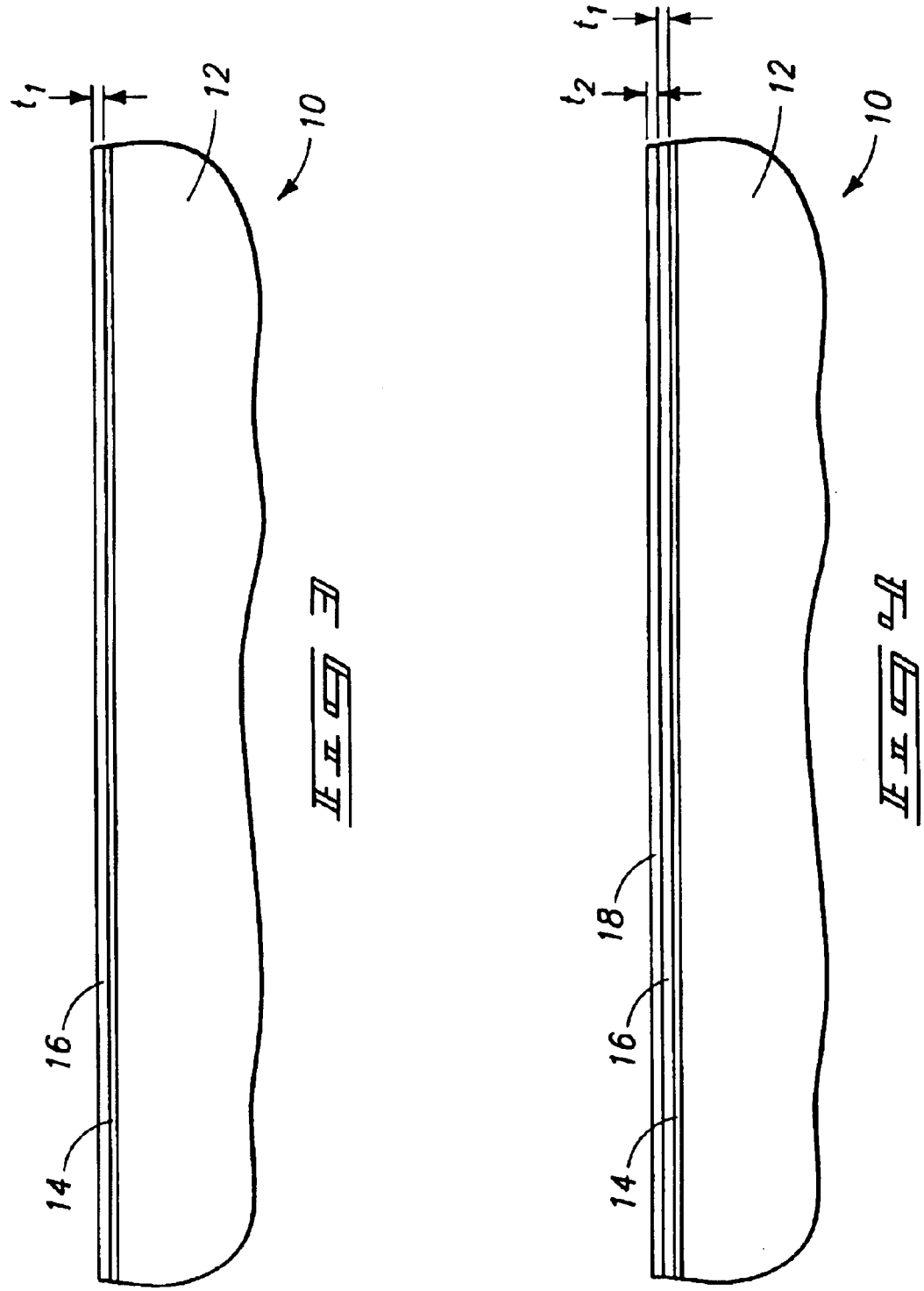

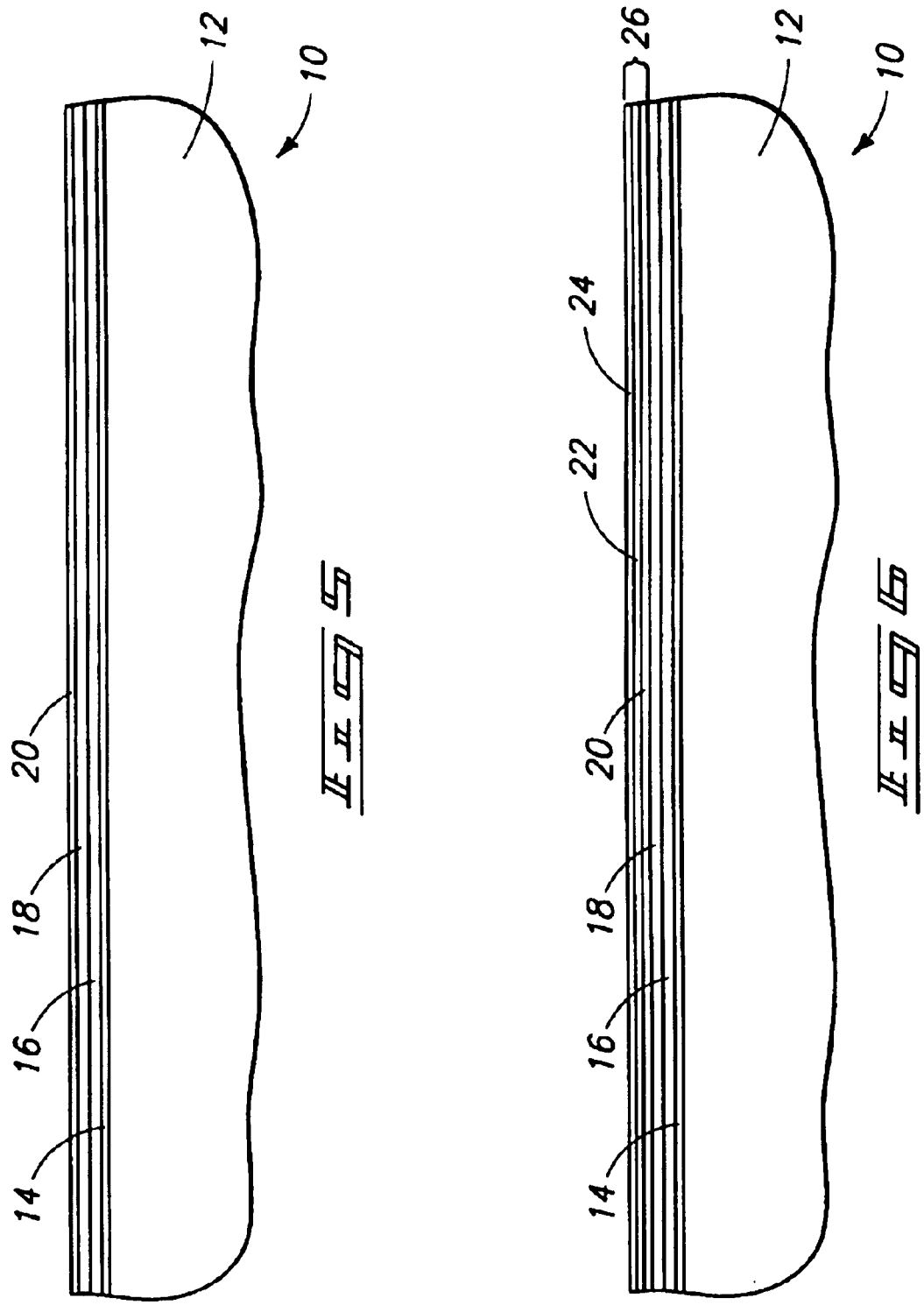

US 6,791,141 B1

SEMICONDUCTOR CONSTRUCTIONS COMPRISING STACKS WITH FLOATING GATES THEREIN

RELATED PATENT DATA

This patent resulted from a divisional application of U.S. patent application Ser. No. 09/118,359, filed Jul. 17, 1998, entitled "Methods of Enhancing Data Retention of a Floating Gate Transistor, Methods of Forming Floating Gate Transistors, and Floating Gate Transistors", naming J. Dennis Keller and Roger R. Lee as inventors, the disclosure of which is incorporated by reference.

TECHNICAL FIELD

This invention relates to floating gate transistors and methods of forming the same. This invention also relates to methods of enhancing data retention of floating gate transistors.

BACKGROUND OF THE INVENTION

Floating gate transistors are utilized in some semiconductor a memory cells. One type of memory cell that uses a floating gate transistor is a flash erasable and programmable read only memory (EPROM). A floating gate transistor typically includes a tunnel dielectric layer, a floating gate, an interlayer dielectric and a control gate or word line. Source/drain regions are formed operatively adjacent the floating gate and within semiconductive substrate material. A floating gate transistor can be placed in a programmed state by storing charge on the floating gate of the floating gate transistor. Typically, a large, e.g. 25 volts, between the control gate and the substrate allows some electrons to cross the interlayer dielectric and charge the floating gate. The "data-retention" of a floating gate transistor refers to the ability of the transistor to retain its charge over a period of time. Charge can be lost, undesirably, through electron migration from the floating gate through various adjacent materials. One problem which has confronted the industry is electron migration through the interlayer dielectric material immediately above the floating gate. The thickness of the interlayer dielectric material has an impact on the ability of a floating gate to retain its charge. Thinner regions of the interlayer dielectric material provide undesired migration paths for electrons to leave the programmed floating gate relative to other thicker regions of the interlayer dielectric material. Hence, non-uniformity in the thickness of the interlayer dielectric material is undesirable.

A contributing factor to a non-uniformly thick interlayer dielectric material is the presence of a large number of grain boundaries at the interlayer dielectric/floating gate interface. Conductive doping of the floating gate, as is desirable, undesirably increases the number of interface grain boundaries, which in turn, increases the chances of having a non-uniformly thick interlayer dielectric.

This invention grew out of concerns associated with improving the data retention characteristics of floating gate transistors.

SUMMARY OF THE INVENTION

Floating gate transistors and methods of forming the same are described. In one implementation, a floating gate is formed over a substrate. The floating gate has an inner first portion and an outer second portion. Conductivity enhancing impurity is provided in the inner first portion to a greater concentration than conductivity enhancing impurity in the outer second portion. In another implementation, the floating gate is formed from a first layer of conductively doped semiconductive material and a second layer of substantially undoped semiconductive material. In another implementation, the floating gate is formed from a first material having a first average grain size and a second material having a second average grain size which is larger than the first average grain size.

BRIEF DESCRIPTION OF THE DRAWINGS

Preferred embodiments of the invention are described below with reference to the following accompanying drawings.

FIG. 1 is a diagrammatic sectional view of a semiconductor wafer fragment at one processing step in accordance with the invention.

FIG. 2 is a view of the FIG. 1 wafer fragment at a processing step subsequent to, that shown by FIG. 1.

FIG. 3 is a view of the FIG. 1 wafer fragment at a processing step subsequent to that shown by FIG. 2.

FIG. 4 is a view of the FIG. 1 wafer fragment at a processing step subsequent to that shown by FIG. 3.

FIG. 5 is a view of the FIG. 1 wafer fragment at a processing step subsequent to that shown by FIG. 4.

FIG. 6 is a view of the FIG. 1 wafer fragment at a processing step subsequent to that shown by FIG. 5.

DETAILED DESCRIPTION OF THE PREFERRED EMBODIMENTS

Figure 7:
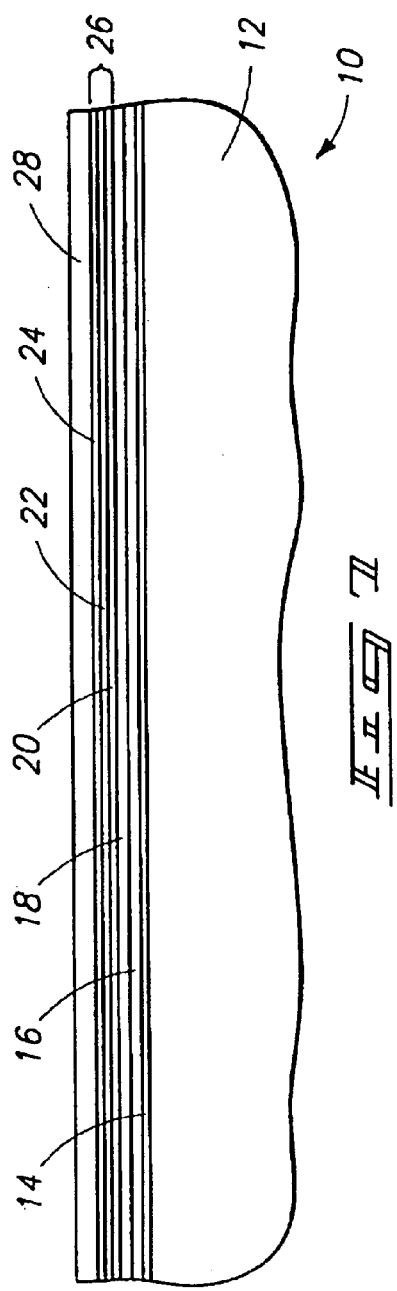
FIG. 7 is a view of the FIG. 1 wafer fragment at a processing step subsequent to that shown by FIG. 6.

This disclosure of the invention is submitted in furtherance of the constitutional purposes of the U.S. Patent Laws "to promote the progress of science and useful arts" (Article 1, Section 8).

Referring to FIG. 1, a fragmentary portion of a semiconductor wafer is shown generally at 10 and comprises a semiconductive substrate 12. As used in this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials)The term "substrate" refers to any supporting structure, including, but not limited to, the semiconductive substrates described above.

A Referring to FIG. 2, a layer 14 is formed over substrate 12 and constitutes a tunnel oxide layer.

Referring to FIG. 3, a layer 16 is formed over substrate 12 as depicted, layer 16 is disposed on and in continuous contact with layer 14. In a preferred implementation, layer 16 constitutes a polysilicon layer which is formed to a first thickness $t_1$. Preferably, the polysilicon of layer 16 is undoped as formed and is subsequently doped, as through ion implantation, with conductivity enhancing impurity to a desired degree. According to one aspect, layer 16 is doped with a suitable impurity which is sufficient to define a sheet resistance of between 300 ohm/sq. and 400 ohm/sq. According to another aspect, first layer 16 is doped with an impurity concentration which is greater than or equal to about $1\times10^{18}$ $cm^{-3}$. An exemplary concentration is between about $1\times10^{18}$ cm$^{-3}$ and 1×10$^{20}$ cm$^{-3}$, or greater. A suitable and preferred dopant or impurity is phosphorous. When phosphorous is utilized, the preferred sheet resistance is between about 600 ohm/sq. and 700 ohm/sq.

Alternately considered, layer 16 constitutes a first material or silicon-containing volume which is formed over the substrate and doped with a suitable impurity concentration to define a first average grain size. Accordingly, such silicon-containing volume has a first average grain boundary area per unit volume. An exemplary grain size is between about 50–100 nm, or greater than about 25 grain boundaries in an erase area of 0.2 $\mu$m$^2$ to 0.4 $\mu$m$^2$.

Referring to FIG. 4, a second layer 18 is formed over the substrate 12 and first layer 16. Preferably, layer 18 is formed directly atop layer 16 and to a second thickness $t_2$. Preferably, second layer 18 constitutes a material such as polysilicon or amorphous silicon which is substantially undoped relative to first layer 16. The term "substantially undoped" as used within this document will be understood to mean having an impurity concentration which is less than 1×10$^8$ cm$^{-3}$. In accordance with one aspect of the invention, second layer 18 constitutes a second material which is formed over material of layer 16 to have a second average grain size which is larger than the first average grain size of layer 16. Accordingly, second layer 18 constitutes a second silicon-containing volume having a second grain boundary area per unit volume which is less than the first grain boundary area per unit volume. An exemplary grain size is between about 100–200 nm or about 25 grain boundaries in an erase area of 0.2 $\mu$m$^2$ to 0.4 $\mu$m$^2$.

In a preferred implementation, the material of layers 16, 18, taken together, constitute material from which a floating gate of a floating a gate transistor will be formed. Layers 16, 18 define an aggregate or combined thickness ($t_1+t_2$). Accordingly to one aspect, the combined thickness of layers 16, 18 is less than or equal to about 1000 Angstroms. Such combined thickness can, however, range upward to around 1500 Angstroms or greater. The combined thickness can range downward as well. This is especially true as advances in scalability result in smaller floating gate dimensions. In one implementation, the first and second thicknesses are substantially the same. Accordingly, when the aggregate or combined thickness is around 1000 Angstroms, individual thicknesses $t_1$ and $t_2$ would be around 500 Angstroms. In another implementation, first and second thicknesses $t_1$ and $t_2$ can be different from one another. Accordingly, first thickness $t_1$ can constitute less than or equal to about 75% of the aggregate thickness. In another implementation, first thickness $t_1$ can constitute at least 25% of the aggregate or combined thickness of the floating gate. In yet another implementation, layer 16 can comprise between about 25–75% of the floating gate thickness. Where the aggregate thickness is about 1000 Angstroms, the first thickness would be between 250–750 Angstroms. First thickness $t_1$ can be less than 550 Angstroms, or between 450 Angstroms and 550 Angstroms. In another implementation, the combined or aggregate thickness ($t_1+t_2$) can equal around about 500 Angstroms, with thickness $t_1$ being equal to around 25–50 Angstroms. Other relative thickness relationships are of course possible.

Referring still to FIG. 4, layers 16 and 18 are subjected to suitable floating gate definition steps. In a first step, floating gate material 16, 18 is etched into and out of the plane of the page upon which FIG. 4 appears. Such effectively defines so-called floating gate wings which overlie field oxide which is not specifically shown in the FIG. 4 construction. The first etch partially forms a plurality of floating gates having respective inner first portions (layer 16) disposed proximate the substrate, and respective outer second portions (layer 18) disposed over the first portions.

Referring to FIG. 5, substrate 12 is subjected to suitable oxidizing conditions which are effective to form a first oxide layer 20 over second layer 18. Layer 20 constitutes a bottom oxide layer which is formed to a thickness of between about 50 Angstroms to 100 Angstroms.

Referring to FIG. 6, a layer 22 is formed over substrate 12 and preferably constitutes a nitride layer which is formed over first oxide layer 20. Substrate 12 is subsequently subjected to oxidizing conditions which are sufficient to form a second oxide layer 24 over nitride layer 22. Taken together, layers 20, 22, and 24 constitute an ONO dielectric layer which constitutes a third layer 26 of dielectric material which is formed over the second silicon-containing volume or second layer 18. Other dielectric layers are possible.

Referring to FIG. 7, a fourth layer 28 is formed over third layer 26 and comprises a conductive material. In a preferred implementation, layer 28 constitutes a third layer of polysilicon which is formed over second oxide layer 24 and will constitute a conductive line for the floating gate transistor to be formed.

Figure 8:
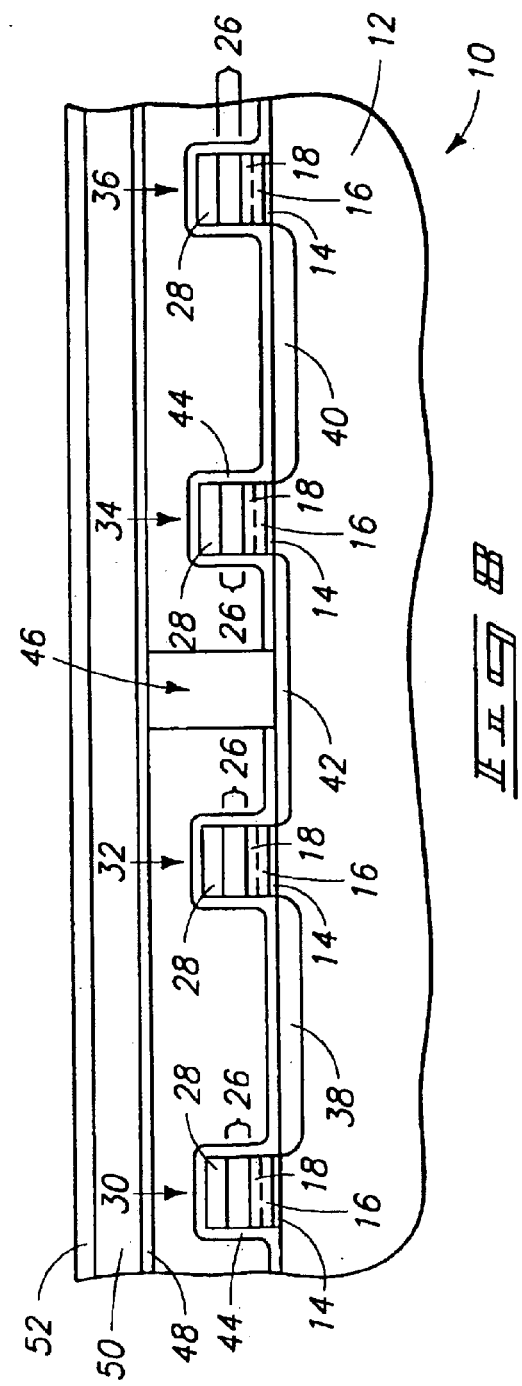
FIG. 8 is a view of the FIG. 1 wafer fragment at a processing step subsequent to that shown by FIG. 7.

Referring to FIG. 8, the various layers of FIG. 7 are etched to provide a plurality of floating gate transistors 30, 32, 34, and 36 as depicted each floating gate transistor has tunnel oxide 14 in continuous contact with first material 16, and is disposed over substrate 12 in a manner such that essentially none of tunnel oxide 14 overlies one of source regions 38, 40 or drain region 42. Such defines the remaining opposing edges of the floating gates of such transistors. The floating gate transistors are also provided with respective source/drain regions which are disposed laterally proximate the floating gates. In the illustrated example, individual source regions 38, 40 and a drain region 42 are shown. Additionally, an oxide layer 44 is disposed over individual floating gates 30, 32, 34, and 36. A plug 46 comprising conductive contact film material is disposed operatively adjacent drain region 42 and serves to electrically connect with such drain region. A barrier layer 48, metal layer 50 and a passivation layer 52 are shown.

The above-described floating gate construction provides an improved floating gate transistor which is less prone to lose its charge due to electron migration from the floating gate through the dielectric layer intermediate the floating gate and the overlying word line. Such improvements increase the data retention characteristics of the floating gate. The improvements are made possible, in part, through a more uniformly thick bottom oxide layer (oxide layer 20) of the ONO dielectric layer discussed above. Such a uniformly thick layer provides less opportunities for electrons to migrate away from the floating gate.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor construction, comprising:

a pair of discrete stacks over the a substrate and spaced from one another by an intervening gap, the stacks comprising top surfaces and sidewall surfaces extending from the top surfaces to the substrate, wherein each of the stacks comprises:
a tunnel oxide layer over the substrate;
a floating gate physically against and over the tunnel oxide layer, the floating gate having an inner first portion beside the tunnel oxide layer and an outer second portion spaced from the tunnel oxide layer by the inner first portion, the inner first portion containing a concentration of conductivity-enhancing impurity which is greater than a concentration of conductivity-enhancing impurity contained by the outer second portion;
a dielectric layer over the outer second portion; and
a conductive line over the dielectric layer;
a source/drain region within the substrate and between the stacks, wherein the intervening gap and the source/drain region have widths and the source/drain region width is less than or equal to the intervening gap width; and
a first oxide layer extending along the top surfaces and sidewall surfaces of the stacks, wherein the first oxide layer is physically against the floating gate, dielectric layer and conductive line along the sidewall surfaces of the stacks.

2. The semiconductor construction of claim 1, wherein the first oxide layer comprises a constant thickness along the top surfaces and sidewall surfaces of the stacks and across the diffusion region.

3. The semiconductor construction of claim 1, wherein the inner first portion has an impurity concentration of greater than or equal to about $1 \times 10^{18}$ cm$^{-3}$.

4. The semiconductor construction of claim 1, wherein the conductivity-enhancing impurity concentration of the inner first portion is greater than or equal to about $1 \times 10^{18}$ cm$^{-3}$ and the conductivity-enhancing impurity concentration of the outer second portion is less than $1 \times 10^{18}$ cm$^{-3}$.

5. The semiconductor construction of claim 1, wherein the floating gate has a gate thickness comprising an inner first portion thickness and an outer second portion thickness, the inner first portion thickness being less than about 75 percent of the gate thickness.

6. The semiconductor construction of claim 1, wherein the floating gate has a gate thickness comprising an inner first portion thickness and an outer second portion thickness, the inner first portion thickness being less than or equal to about 50 percent of the gate thickness.

7. The semiconductor construction of claim 1 wherein the floating gate has a gate thickness comprising an inner first portion thickness and outer second portion thickness, the inner first portion thickness being from about 25% to about 75% of the gate thickness.

8. The semiconductor construction of claim 1 wherein the inner first portion has a sheet resistance of from about 300 ohm/sq. to about 700 ohm/sq.

9. The semiconductor construction of claim 1 wherein the inner first portion has a sheet resistance of from about 300 ohm/sq. to about 400 ohm/sq.

10. The semiconductor construction of claim 1 wherein the tunnel oxide layer has a width and the tunnel oxide layer width defines a width of substrate below the tunnel oxide layer, the source/drain region not extending into the width of substrate.

11. The semiconductor construction of claim 1 wherein the tunnel oxide layer has a width and the tunnel oxide layer width defines a width of substrate bellow the tunnel oxide layer, the source/drain region not extending into the width of substrate.

12. A semiconductor construction, comprising:
a pair of discrete stacks over a substrate and spaced from one another by an intervening gap;
a source/drain region within the substrate and between the stacks, the intervening gap and the source/drain region having widths and the source/drain region width being less than or equal to the intervening gap width, wherein each of the stacks comprises:
a tunnel oxide layer over the substrate;
a floating gate physically against and over the tunnel oxide layer, the floating gate including a first material beside the tunnel oxide layer and a second material spaced from the tunnel oxide layer by the first material, the first material having a first average grain size and the second material having a second average grain size, the second average grain size being larger than the first average grain size;
a dielectric layer over the second material; and
a conductive line over the dielectric layer; and
a first oxide layer conformally around the stacks and over the source/drain region, wherein the first oxide layer is physically against the floating gate, dielectric layer and conductive line.

13. The semiconductor construction of claim 12 wherein the first oxide layer comprises a constant thickness around the stacks and across the diffusion region.

14. The semiconductor construction of claim 12 wherein the first material has a sheet resistance of less than about 400 ohm/sq.

15. The semiconductor construction of claim 12 wherein the floating gate has a gate thickness comprising a first material thickness and a second material thickness, the first material thickness being less than 75 percent of the gate thickness.

16. The semiconductor construction of claim 12 wherein the floating gate has a gate thickness comprising a first material thickness and a second material thickness and the first material thickness is less than the second material thickness.

17. The semiconductor construction of claim 12 wherein the first material comprises polysilicon having an average grain size of from between about 50 to about 100 nanometers and the second material comprises polysilicon having an average grain size of from between about 100 to about 200 nanometers.

18. The semiconductor construction of claim 12 wherein the floating gate has a gate thickness comprising a first material thickness and a second material thickness, the first material thickness being from about 25% to about 75% of the gate thickness.

19. The semiconductor construction of claim 12 wherein the first material has a sheet resistance of from about 300 ohm/sq. to about 700 ohm/sq.

20. The semiconductor construction of claim 12 wherein the first material has a sheet resistance of from about 300 ohm/sq. to about 400 ohm/sq.

21. The semiconductor construction of claim 12 wherein the tunnel oxide layer has a width and the tunnel oxide layer width defines a width of substrate below the tunnel oxide layer, the source/drain region not extending into the width of substrate.

22. A floating gate transistor construction comprising:
a tunnel oxide layer over a substrate, the tunnel oxide layer having a width and the tunnel oxide layer width defines a width of substrate below the tunnel oxide layer, wherein the width of substrate is substantially free of source/drain region dopant;

a floating gate over the tunnel oxide layer, the floating gate having an inner first portion beside the tunnel oxide layer and an outer second portion spaced from the tunnel oxide layer by the inner first portion, the inner first portion containing a concentration of conductivity-enhancing impurity which is greater than a concentration of conductivity-enhancing impurity contained by the outer second portion;

a dielectric layer over the outer second portion;

a conductive line over the dielectric layer;

the tunnel oxide layer, conductive line, dielectric layer and floating gate being comprised by a stack; the stack having a top and a sidewall extending substantially vertically between the top and the substrate; and a layer of insulative material extending along the sidewall and over the top of the stack.

23. The floating gate transistor of claim 22 wherein the floating gate has a gate thickness comprising an inner first portion thickness and an outer second portion thickness, the inner first portion thickness being from about 25% to about 75% of the gate thickness.

24. The floating gate transistor of claim 22 wherein the floating gate has a gate thickness comprising the an inner first portion thickness and an outer second portion thickness, the inner first portion thickness being less than about 75% of the gate thickness.

25. The floating gate transistor of claim 22 wherein the floating gate has a gate thickness comprising an inner first portion thickness and an outer second portion thickness, the inner first portion thickness being less than or equal to about 50% of the gate thickness.

26. The floating gate transistor of claim 22 wherein the concentration of conductivity-enhancing impurity of the inner first portion is greater than or equal to $1 \times 10^{18}$ cm$^{-3}$ and the concentration of conductivity-enhancing impurity of the outer second portion is less than $1 \times 10^{18}$ cm$^{-3}$.

27. The floating gate transistor of claim 26 wherein the concentration of conductivity-enhancing impurity of the inner first portion is from about $1 \times 10^{18}$ cm$^{-3}$ to about $1 \times 10^{20}$ cm$^{-3}$.

28. A floating gate transistor construction, comprising:

a tunnel oxide layer over a substrate, the tunnel oxide layer having a width and the tunnel oxide layer width defines a width of substrate below the tunnel oxide layer, wherein the width of substrate is substantially free of source/drain region dopant;

a floating gate over the tunnel oxide layer, the floating gate having an inner first portion beside the tunnel oxide layer and an outer second portion spaced from the tunnel oxide layer by the inner first portion, the inner first portion having a first average grain size and the outer second portion having a second average grain size, the second average grain size being larger than the first average grain size;

a dielectric layer over the outer second portion;

a conductive line over the dielectric layer;

the tunnel oxide layer, conductive line, dielectric layer and floating gate being comprised by a stack; the stack having a top and a sidewall extending substantially vertically between the top and the substrate; and a layer of insulative material extending along the sidewall and over the top of the stack.

29. The floating gate transistor of claim 28 wherein the floating gate has a gate thickness comprising an inner first portion thickness and an outer second portion thickness, the inner first portion thickness being from about 25% to about 75% of the gate thickness.

30. The floating gate transistor of claim 28 wherein the floating gate has a gate thickness comprising an inner first portion thickness and an outer second portion thickness, the inner first portion thickness being less than about 75% of the gate thickness.

31. The floating gate transistor of claim 28 wherein the floating gate has a gate thickness comprising an inner first portion thickness and outer second portion thickness, the inner first portion thickness being less than or equal to about 50% of the gate thickness.

32. The floating gate transistor of claim 28 wherein the average grain size of the inner first portion is from about 50 nanometers to less than 100 nanometers and the average grain size of the outer second portion is greater than 100 nanometers.

33. The floating gate transistor of claim 32 wherein the average grain size of the outer second portion is less than about 200 nanometers.

* * * * *

UNITED STATES PATENT AND TRADEMARK OFFICE
CERTIFICATE OF CORRECTION

PATENT NO. : 6,791,141 B1
DATED : September 14, 2005
INVENTOR(S) : Keller et al.

It is certified that error appears in the above-identified patent and that said Letters Patent is hereby corrected as shown below:

Title page,
Item [56], References Cited, FOREIGN PATENT DOCUMENTS, please delete "KP" before "10-135358" and insert -- JP --.

Column 2,
Line 50, please delete "materials), The" after "other" and insert -- materials). The --.

Column 4,
Line 66, please delete "the" after "over" and insert -- a --.

Signed and Sealed this

Nineteenth Day of July, 2005

JON W. DUDAS
*Director of the United States Patent and Trademark Office*